US010295913B2

(12) United States Patent
Middlebrooks et al.

(10) Patent No.: US 10,295,913 B2
(45) Date of Patent: May 21, 2019

(54) INSPECTION METHOD AND APPARATUS, AND CORRESPONDING LITHOGRAPHIC APPARATUS

(71) Applicant: ASML Netherlands B.V., Veldhoven (NL)

(72) Inventors: Scott Anderson Middlebrooks, Duizel (NL); Rene Andreas Maria Pluijms, Eersel (NL); Martyn John Coogans, Eindhoven (NL); Marc Johannes Noot, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 862 days.

(21) Appl. No.: 13/667,174

(22) Filed: Nov. 2, 2012

(65) Prior Publication Data
US 2013/0135600 A1 May 30, 2013

Related U.S. Application Data

(60) Provisional application No. 61/565,417, filed on Nov. 30, 2011.

(51) Int. Cl.
G03F 7/20 (2006.01)

(52) U.S. Cl.
CPC ...... *G03F 7/70625* (2013.01); *G03F 7/70525* (2013.01); *G03F 7/70641* (2013.01)

(58) Field of Classification Search
CPC .............. G01N 21/9501; G01N 21/956; G03F 7/70525; G03F 7/70558; G03F 7/70616; G03F 7/70625; G03F 7/70633; G03F 7/70641; G03F 7/70675; G03F 7/70683; G03F 9/7019; G03F 9/7026; G03F 9/7092

(Continued)

(56) References Cited

U.S. PATENT DOCUMENTS 6,507,800 B1 * 1/2003 Sheu .............................. 702/117
7,523,439 B2 4/2009 Wen et al.
(Continued)

FOREIGN PATENT DOCUMENTS

EP 1 628 164 A2 2/2006
JP 5332007 B2 11/2013

OTHER PUBLICATIONS

International Search Report directed to related International Patent Application No. PCT/EP2012/071427, dated Mar. 8, 2013; 2 pages.
(Continued)

Primary Examiner — Colin W Kreutzer
(74) Attorney, Agent, or Firm — Sterne, Kessler, Goldstein & Fox P.L.L.C.

(57) ABSTRACT

An inspection method, and corresponding apparatus, enables classification of pupil images according to a process variable. The method comprises acquiring diffraction pupil images of a plurality of structures formed on a substrate during a lithographic process. A process variable of the lithographic process varies between formation of the structures, the variation of the process variable resulting in a variation in the diffraction pupil images. The method further comprises determining at least one discriminant function for the diffraction pupil images, the discriminant function being able to classify the pupil images in terms of the process variable.

16 Claims, 4 Drawing Sheets

Figure 1:
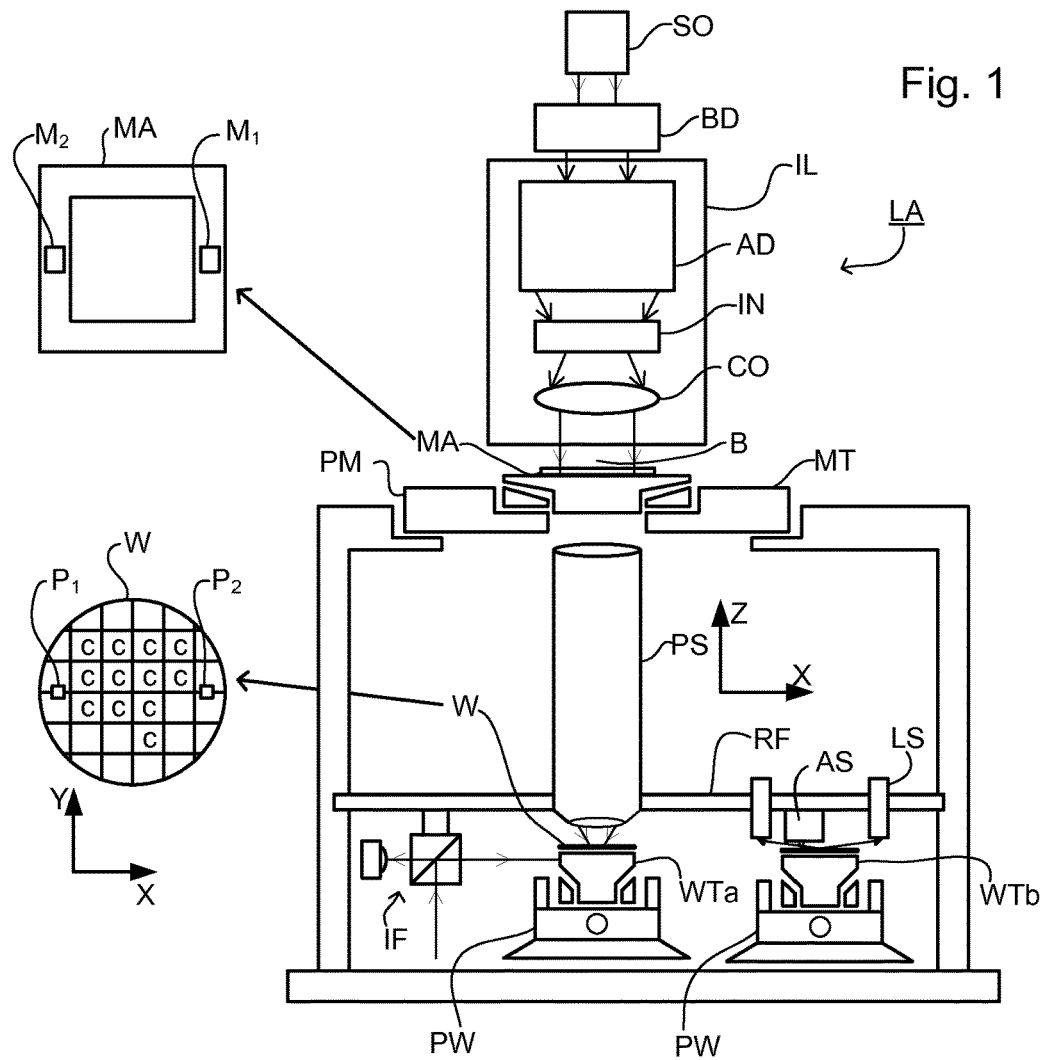

(58) Field of Classification Search
USPC .................. 355/53, 67, 77; 356/237.5, 369,
356/399–401, 625; 430/22, 30
See application file for complete search history.

(56) References Cited

U.S. PATENT DOCUMENTS

2008/0128644 A1* 6/2008 Mos et al. ............... 250/559.07
2010/0296072 A1* 11/2010 Baselmans ............. G02B 5/005
355/71
2012/0078527 A1* 3/2012 Yoo et al. ...................... 702/19

OTHER PUBLICATIONS

International Preliminary Report on Patentability and Written Opinion of the International Searching Authority directed to related International Patent Application No. PCT/EP2012/071427, dated Jun. 3, 2014; 7 pages.
Bingham, P.R., et al., "Semiconductor sidewall shape estimation," Journal of Electronic Imaging, vol. 13, No. 3, Jul. 2004; pp. 474-485.
Krukar, R., et al., "Reactive ion etching profile and depth characterization using statistical and neural network analysis of light scattering data," Journal of Applied Physics, vol. 74, No. 6, Sep. 15, 1993; pp. 3698-3706.
Miyoshi, S., et al., "Novel prediction methodology for etched hole patterning failure," Proceedings of SPIE, Metrology, Inspection, and Process Control for Microlithography XXVI, vol. 8324, 2012; pp. 83241J-1 to 83241J-10.
Sylvain, V., et al., "Fault Detection with Bayesian Network," Frontiers in Robotics, Automation, and Control, Chapter 18, Oct. 2008; pp. 341-356.

\* cited by examiner

INSPECTION METHOD AND APPARATUS, AND CORRESPONDING LITHOGRAPHIC APPARATUS

FIELD

The present invention relates to methods of inspection usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

The quality of a structure exposed in a lithographic process is highly dependent on a number of parameters such as inter alia the focus settings and dose (intensity) of the illumination beam or the lithographic tool or scanner type, used during the exposure process. It is therefore often desirable to inspect a structure so as to obtain information on the focus, dose, tool, scanner type or other parameter used during its exposure. Currently, this requires previous knowledge of structure information or the optical properties of the structure. It is also requires computationally intensive reconstruction steps or library usage to make an estimate of the parameter used.

SUMMARY

It is desirable to provide a method that obviates or reduces one or more of the abovementioned requirements.

According to an aspect of the present invention, there is provided an inspection method comprising acquiring diffraction pupil images of a plurality of structures formed on a substrate during a lithographic process, a process variable of the lithographic process having been varied between formation of the structures, the variation of the process variable resulting in a variation in the diffraction pupil images, and determining at least one discriminant function for the diffraction pupil images, the discriminant function being able to classify the pupil images in terms of the process variable.

Also disclosed are an inspection tool and combination of an inspection tool and lithographic apparatus, operable to perform the methods disclosed herein.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 2:
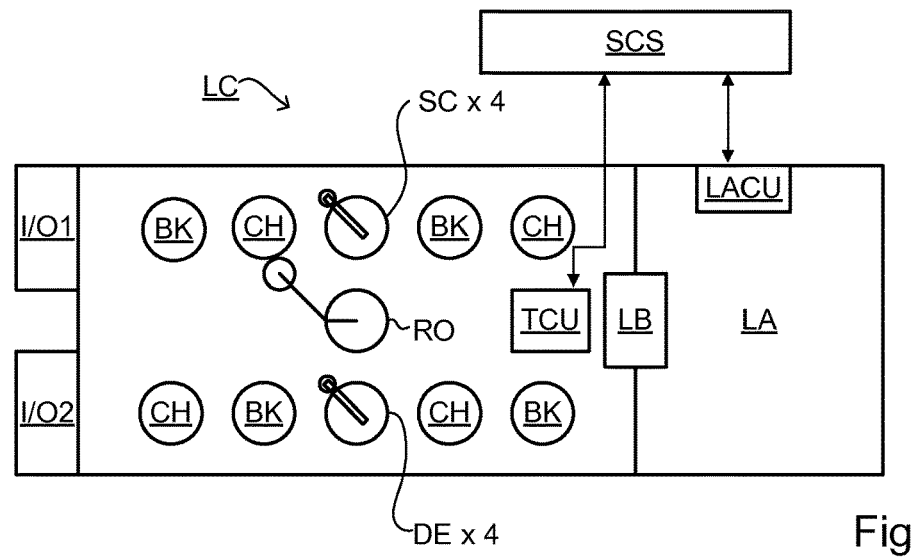
Figure 3:
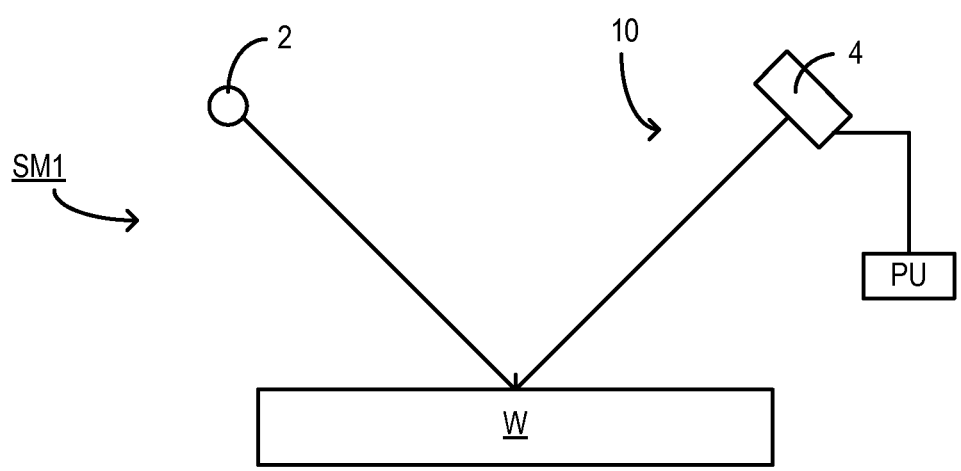
Figure 3:
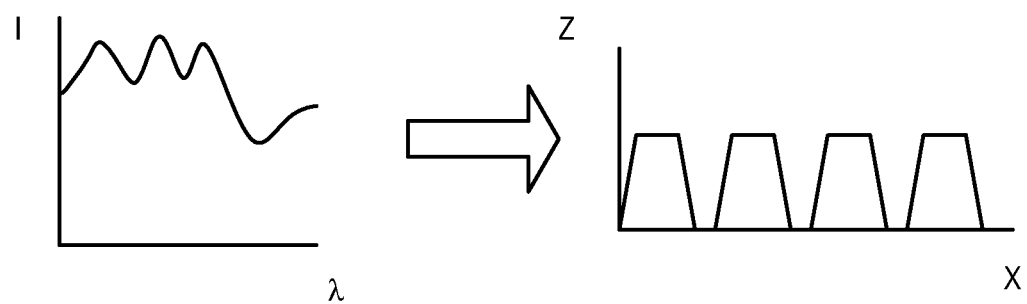
Figure 4:
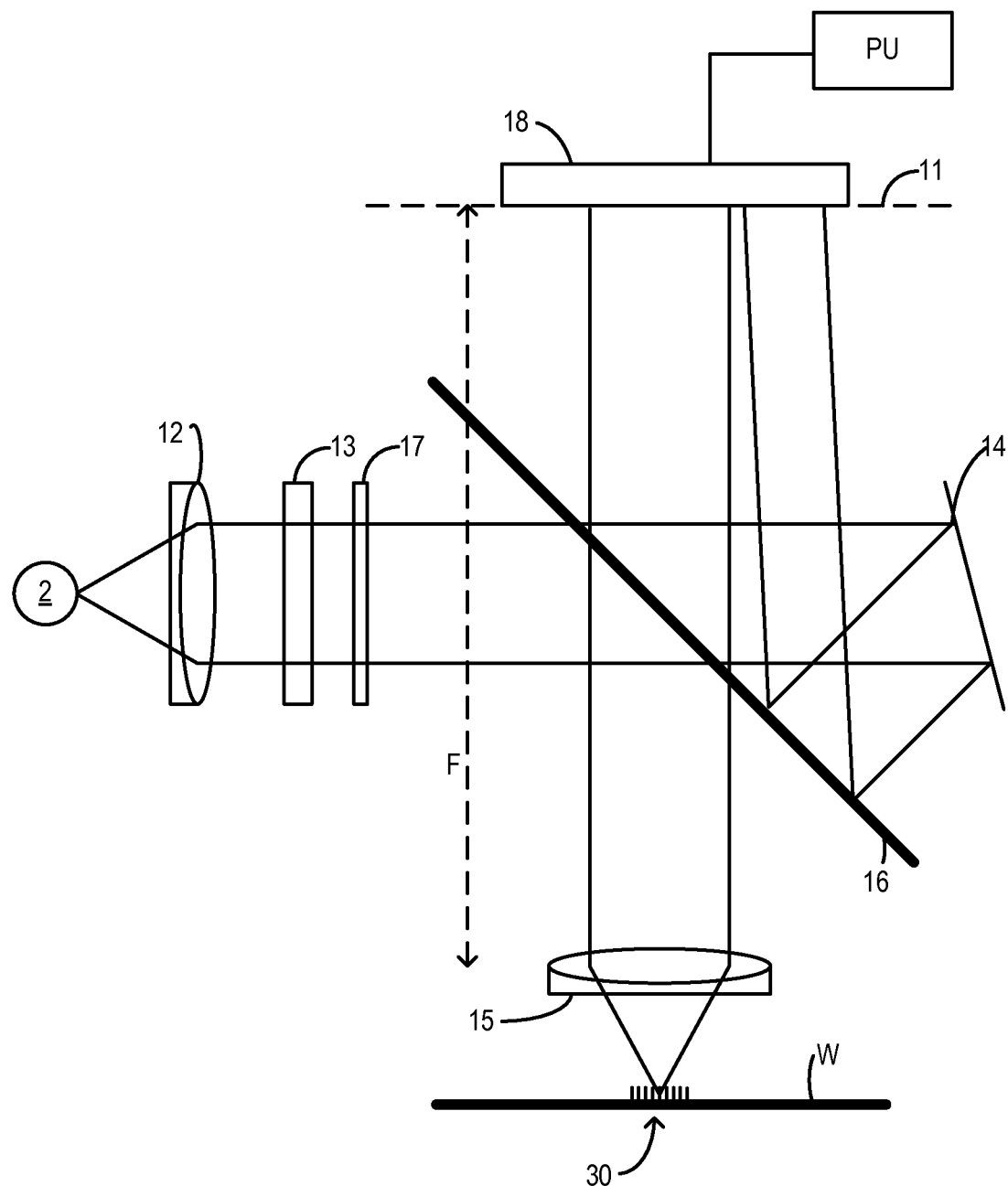
Figure 5:
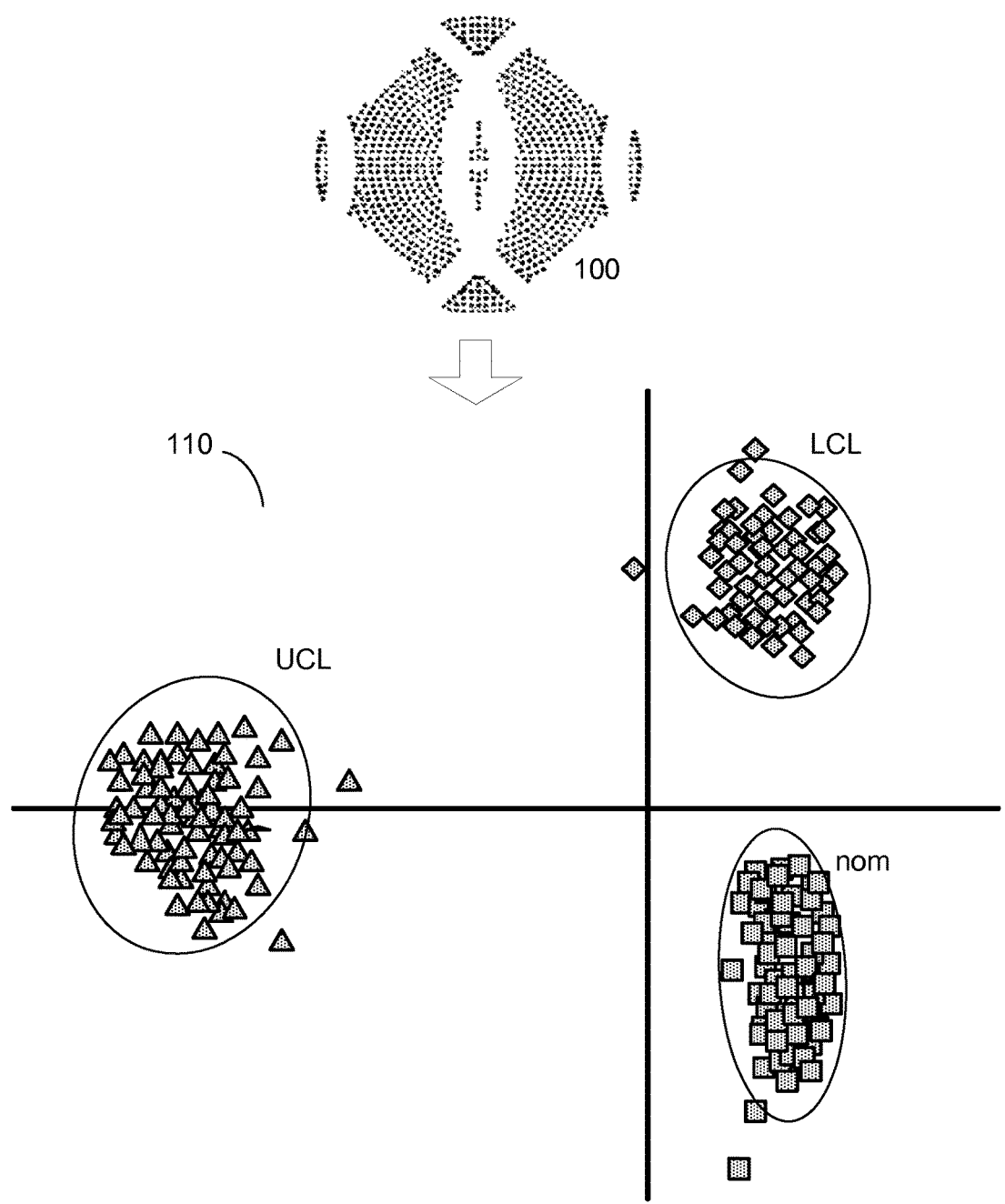

FIG. 1 depicts a lithographic apparatus.
FIG. 2 depicts a lithographic cell or cluster.
FIG. 3 depicts a first scatterometer.
FIG. 4 depicts a second scatterometer.
FIG. 5 depicts a process according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, 1/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least $2\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Conventionally, using one of the scatterometers described above in combination with modeling of a target structure such as the target 30 and its diffraction properties, measurement of the shape and other parameters of the structure can be performed in a number of ways. In a first type of process a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit. However, a major drawback of these types of reconstruction methods is that they are highly computationally intensive.

There are a number of important parameters that affect an exposed structure, and therefore its diffraction pattern (pupil image) when inspected. Purely for illustration, two such parameters that effect the exposure action that the lithographic apparatus carries out are focus and dose, as will be described below. However, the concepts described herein are applicable to the categorisation of pupil images in terms of any parameter that affects exposure.

The dose of radiation that is projected onto a substrate in order to expose it is controlled by various parts of the exposure apparatus (of the lithographic apparatus). It is (mainly) the combination of alignment (focus alignment) and the projection system of the lithographic apparatus that is responsible for the focus of the radiation onto the correct portions of the substrate. It is important that the focusing occurs at the level of the substrate, rather than above or below, so that the sharpest image will occur at the level of the substrate and the sharpest pattern possible may be exposed thereon. This enables, for example, smaller product patterns to be printed.

The focus and dose of the radiation directly affect the parameters of the patterns or structures that are exposed on the substrate. Parameters that can be measured using a scatterometer are physical properties of structures that have been printed onto a substrate such as the critical dimension (CD) or sidewall angle (SWA) of, for example, a bar-shaped grating type structure. The critical dimension is effectively the mean width of a structure such as a bar (or a space, dot or hole, depending on what the measured structures are). The sidewall angle is the angle between the surface of the substrate and the rising (or falling) portion of the structure.

Focus and dose have been determined simultaneously by scatterometry (or scanning electron microscopy) from structures in the mask pattern (which gives rise to target structures on the substrate, from which measurements are taken). The targets can be designed to have high sensitivity of the critical dimension and sidewall angle for focus and dose. Multiple targets with different sensitivities (e.g., a semi isolated structure and a dense grating) may be chosen such that, when exposed and processed, a possibly unique combination of critical dimension and sidewall angle measurements result from each of the targets. If these unique combinations of critical dimension and sidewall angle are available, the focus and dose values can be uniquely determined from these measurements, although there can never be any guarantee that the inversion of critical dimension and sidewall angle to focus and dose has only one unique solution.

It is known to use a model to describe the critical dimension and sidewall angle as a function of focus and dose, this focus dose model being calibrated using experimental data from a "set-get" experiment such as a focus exposure matrix (FEM). A "set-get" experiment is one where the focus is set with a range of offsets and measurements are made to obtain or "get" the CD or SWA. A FEM wafer may be used as calibration wafer for the scatterometer. As is known in the art, a FEM wafer comprises a wafer that has been coated with a photoresist onto which a pattern is exposed with multiple combinations of focus and exposure offsets. The FEM wafer is measured by the metrology tool to determine SWA and CD using the computationally intensive reconstruction methods described above, and the corresponding focus and exposure settings are determined that most closely match a desired profile and line width to calibrate the focus dose model. The calibrated model can then be used to measure and infer the focus values for subsequent measurements.

All of these techniques require detailed prior knowledge of the stack being measured; its optical properties (n&k values), nominal thicknesses and processing steps. However, this involves the solution of two inverse problems, those of CD/SWA reconstruction and of focus or dose inference (or inference of other changed parameter, as is relevant).

FIG. 5 illustrates an embodiment for classifying captured diffracted pupil images of periodic structures obtained using a scatterometer, which can be used to address this issue. It is proposed that periodic structures are exposed on semiconductor product wafers with different parameter settings, or using different lithographic tools or changing any other variable which may affect the exposed structures. For example, to address the specific issues raised above the parameter settings changed between exposures could be focus and/or dose. Then, using angle resolved scatterometry, diffraction pupil images are acquired on these structures. Machine learning techniques are then employed to determine a discriminant function. This discriminant function can then be used to classify subsequent measured images.

The discriminant function is a function that takes as its input the feature vector, which in this case is a vectorized pupil image, and returns (in the binary case) a 1 or a 0. If the discriminant function returns a 1, the measured feature is classified in class A, else it is classified in class B. Typical discriminant functions include inter alia logistic regression, support vector machines and linear discriminant analysis. This discriminant function may be determined via an experiment. For example, suppose that many pupil measurements are obtained from a wafer that was processed with a negative focus offset. These sets of measurements are labeled as class A. Similarly, pupil measurements are also obtained from a wafer that was processed with a positive focus offset. These sets of measurements are labeled as class B. Standard model identification steps can be utilized to determine a discriminant function from this data, which is a function that will categorize a pupil image as class A or class B. A cost function is defined and minimized over the model parameters. The resulting model (discriminant function) is then tested and validated. Once an accurate model has been identified, it can be employed to classify new measurements as coming from a negative focus offset (defocus of pupils labeled "class A") or positive focus offset (defocus of pupils labeled "class B").

The above example details pair-wise (binary) classification. However the methods disclosed herein are equally applicable to multi-class classification. In such a case, greater resolution is obtained by having more than two classes. This resolution may reflect multiple levels of acceptability of quality, for example.

FIG. 5 shows the diffraction pupil image 100, and the resultant plot 110 which shows how the classes look in the Fisher space. This is a quick way to visualize how separable the classes are. The axes are the 2 most significant Fisher directions. The measured images have been categorized into three groups labeled LCL (lower control limit), UCL (upper control limit) and nom (nominal). UCL and LCL are the lower and upper control limits of the process. By defining groups in terms of control limits, yield can be directly monitored. If the process is seen to go outside of these limits, yield is jeopardized and alarms may be sounded. The process engineer can then bring the process back to nominal. The process engineer defines these specified limits. Nominal, UCL, and LCL are important classes to characterize new measurements into, however it is certainly possible to create more classes in between these limits in order to obtain a classification that is more resolved (more than 3), or to define other classes entirely.

A primary advantage of this method is that it is possible to directly observe focus disturbances (or whatever parameter is being considered) in-die. Rather than measuring a marker that is created and placed in the scribe, this method makes it possible to measure directly on the product (DRAM structures, SRAM, etc.). Thus, with this method, it is possible to directly measure the yield of the product. This observation can then be utilized as a key metric in a fault detection system, as well as a process state for a feedback controller.

Other benefits include there being no requirement to have previous knowledge of product stack information or the optical properties of the stack. There is also no requirement for computationally intensive reconstruction steps or library usage to make an estimate of the focus and/or dose (or other parameter). Therefore there is no calculation time required and the set up time is restricted only by the move acquire measure time of the scatterometry tool.

While specific consideration has been given to the focus and dose parameters, it will be readily apparent to the skilled person the concepts disclosed herein are applicable to other classifications that occur in the fab. It is possible to characterize many things in the fab with these methods, for example: tool matching, process characterization.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An inspection method comprising:
    illuminating a plurality of structures using a scatterometer optical system with a high numerical aperture of at least 0.9;
    acquiring diffraction pupil images of the plurality of structures formed on a substrate during a lithographic process, a process variable of the lithographic process having been varied between formation of the structures, the variation of the process variable resulting in a variation in the formed structures and consequently the diffraction pupil images, wherein the acquiring of the diffraction pupil image is performed using a detector arranged at a back-projected pupil plane or at a reimage back-projected pupil plane of the scatterometer; and
    determining at least one discriminant function for the diffraction pupil images, the discriminant function being able to classify the pupil images in terms of the process variable,
    wherein the determining the discriminant function includes at least one of logistic regression and support vector machines.

2. The method of claim 1, wherein the discriminant function is used to classify subsequent measured diffraction pupil images.

3. The method of claim 2, wherein the measured diffraction pupil images are obtained from direct measurement of production structures in-die.

4. The method of claim 1, wherein a plurality of classifications are predetermined for the process variable, the method further comprising:
    labeling each pupil image with its corresponding classification, the corresponding classification being the classification that the process variable belonged to when the structure giving rise to the pupil image was formed; and
    using the labeled pupil images to determine the discriminant function as one which classifies the pupil images according to the predetermined classifications.

5. The method of claim 4, wherein the using the labeled pupil images to determine the discriminant function comprises defining a cost function and minimizing the cost function over the variable range of the process variable.

6. The method of claim 4, wherein the classifications indicate whether the process is within predetermined control limits or are outside of predetermined control limits.

7. The method of claim 6, wherein the classifications comprise upper control limit, lower control limit and nominal, nominal indicating that the process is within the upper and lower control limits.

8. The method of claim 1, wherein the process variable comprises focus or dose settings during the lithography process.

9. The method of claim 1, wherein the process variable comprises a lithography or scanner tool used to perform the process.

10. The method of claim 1, wherein the diffraction pupil images are obtained using angle resolved scatterometry.

11. The method of claim 1, wherein the method comprises the forming of the plurality of structures using a lithographic process while varying the process variable of the lithographic process between formation of the structures.

12. A lithographic apparatus comprising:
    an illumination system configured to condition a radiation beam;
    a support configured to support a patterning device, the patterning device being capable of imparting the radiation beam with a pattern in its cross-section to form a patterned radiation beam;
    a substrate table configured to hold a substrate;
    a projection system configured to project the patterned radiation beam onto a target portion of the substrate; and
    an inspection tool comprising:
        a scatterometer having an optical system with a high numerical aperture of at least 0.9, the scatterometer configured to:
            illuminate a plurality of structures formed on the substrate;
            acquire diffraction pupil images of the plurality of structures formed on the substrate during a lithographic process, a process variable of the lithographic process having been varied between formation of the structures, the variation of the process variable resulting in a variation in the formed structures and consequently the diffraction pupil images, wherein the acquiring of the diffraction pupil image is performed using a detector arranged at a back-projected pupil plane or at a reimage back-projected pupil plane of the scatterometer; and
            determine at least one discriminant function for the diffraction pupil images, the discriminant function being able to classify the pupil images in terms of the process variable,
        wherein the discriminant function includes at least one of logistic regression and support vector machines.

13. A non-transitory computer program product comprising instructions for causing a programmable data processing apparatus to perform as the data processing apparatus performing a method comprising:
    illuminating a plurality of structures using a scatterometer optical system with a high numerical aperture of at least 0.9;
    acquiring diffraction pupil images of the plurality of structures formed on a substrate during a lithographic process, a process variable of the lithographic process having been varied between formation of the structures, the variation of the process variable resulting in a variation in the formed structures and consequently the diffraction pupil images, wherein the acquiring of the diffraction pupil image is performed using a detector arranged at a back-projected pupil plane or at a reimage back-projected pupil plane of the scatterometer; and
    determining at least one discriminant function for the diffraction pupil images, the discriminant function being able to classify the pupil images in terms of the process variable,
    wherein the determining discriminant function includes at least one of logistic regression and support vector machines.

14. The method of claim 1, wherein the acquiring further comprises acquiring the diffraction pupil images having a radial position defining an angle of incidence of the diffracted radiation and an angular position defining an azimuth angle of the diffracted radiation.

15. The lithographic apparatus of claim 12, wherein the acquiring further comprises acquiring the diffraction pupil images having a radial position defining an angle of incidence of the diffracted radiation and an angular position defining an azimuth angle of the diffracted radiation.

16. The non-transitory computer program product of claim 13, wherein the acquiring further comprises acquiring the diffraction pupil images having a radial position defining an angle of incidence of the diffracted radiation and an angular position defining an azimuth angle of the diffracted radiation.

\* \* \* \* \*